US007924636B2

(12) United States Patent
Morimoto et al.

(10) Patent No.: US 7,924,636 B2
(45) Date of Patent: Apr. 12, 2011

(54) ELECTRONIC CIRCUIT DEVICE

(75) Inventors: Hiroyuki Morimoto, Fukuoka (JP); Kazuyuki Nakamura, Iizuka (JP)

(73) Assignee: Kyushu Institute of Technology, Kitakyushu-shi (JP)

( * ) Notice: Subject to any disclaimer, the term of this patent is extended or adjusted under 35 U.S.C. 154(b) by 61 days.

(21) Appl. No.: 12/526,576

(22) PCT Filed: Jan. 29, 2008

(86) PCT No.: PCT/JP2008/051318
§ 371 (c)(1),
(2), (4) Date: Aug. 10, 2009

(87) PCT Pub. No.: WO2008/120488
PCT Pub. Date: Oct. 9, 2008

(65) Prior Publication Data

US 2010/0020625 A1 Jan. 28, 2010

(30) Foreign Application Priority Data

Mar. 29, 2007 (JP) ................................ 2007-089951

(51) Int. Cl.
*G11C 7/00* (2006.01)

(52) U.S. Cl. ................. 365/191; 365/233.1; 365/233.18

(58) Field of Classification Search .................. 365/191, 365/193, 233.1, 233.18, 233.5
See application file for complete search history.

(56) References Cited

U.S. PATENT DOCUMENTS 4,658,201 A 4/1987 Notohamiprodjo ........... 323/224
5,615,058 A 3/1997 Chainer et al. .................. 360/51
5,684,828 A 11/1997 Bolan et al. ................... 375/238
5,717,654 A 2/1998 Manning .................... 365/233.5
5,994,884 A 11/1999 Paterno ......................... 323/268
7,050,419 B2 * 5/2006 Azenkot et al. ............... 370/347
2002/0176199 A1 11/2002 Gomez et al. ................... 360/75

FOREIGN PATENT DOCUMENTS

JP 1-171008 7/1989
JP 06-86540 3/1994
JP 2003-348826 A1 12/2003
JP 2006-170898 A1 6/2006
JP 2007-258294 A1 10/2007
WO WO 90/06633 6/1990

OTHER PUBLICATIONS

"LM317M 3-Terminal Adjustable Regulator;" Texas Instruments product sheet SLVS297O; Apr. 2000; revised Jul. 2006; 12 Sheets./p. 2.

(Continued)

*Primary Examiner* — Gene N Auduong
(74) *Attorney, Agent, or Firm* — Kratz, Quintos & Hanson, LLP

(57) ABSTRACT

To provide an electronic circuit device that can change a characteristic after package sealing and that achieves a reduction in miscellaneous tasks during characteristic setting.

The electronic circuit device includes: a burst detecting circuit 7 for detecting, from an input and output terminal 4, a prescribed write activation burst having a length that is larger than or equal to a prescribed time; a signal-pattern detecting circuit 9 for putting a serial interface 8 into an input-enable state in which setting data can be input, when the write activation burst is detected; and a volatile memory 10 and a nonvolatile memory 11 for storing, in the input-enable state, a setting-data signal input from the input and output terminal 4. An operation state of a functional circuit 6 is set in accordance with the setting data written in the volatile memory 10 or the nonvolatile memory 11.

16 Claims, 3 Drawing Sheets

OTHER PUBLICATIONS

International Search Report for International Application No. PCT/JP2008/051318 dated Apr. 16, 2008.

"LM317M 3-Terminal Adjustable Regulator" Texas Instruments. XP-002584356; Jul. 31, 2006; Retrieved from the Internet: URL:http://focus.tij.co.jp/jp/lit/ds/symlink/lm317m.pdf>[retrieved on May 27, 2010] *the whole document*.

European Search Report dated Jun. 18, 2010.

* cited by examiner

ELECTRONIC CIRCUIT DEVICE

TECHNICAL FIELD

The present invention relates to electronic circuit devices, particularly, devices such as three-terminal regulators and crystal oscillators and, in particular, to an electronic circuit device that allows the function thereof to be freely set in accordance with externally input data.

BACKGROUND ART

Three-terminal electronic circuit devices, such as three-terminal regulators and crystal oscillators, are widely used in various electronic circuits. In such a three-terminal electronic circuit device, a functional circuit mounted on an IC chip or the like is sealed by a resin mold or a package made of ceramic or the like and is connected to an external circuit through three leads. The functional circuit sealed by mold material cannot be accessed through any element other than the three leads, thus making it difficult to adjust a characteristic of the functional circuit. Thus, in general, an externally attached circuit for providing a necessary characteristic is employed or another terminal (a terminal that becomes unusable after sealing with the package) for adjustment is used before sealing with the package to write adjustment data.

For example, in a three-terminal 500 mA adjustable positive-voltage regulator 101 described in Non-Patent Document 1, an external circuit as shown in FIG. 3 is used to adjust an output voltage $V_o$. In the circuit of FIG. 3, the output voltage $V_o$ can be adjusted using a variable resistor $R_2$ and the value of $V_o$ is expressed as $V_o=V_{ref}(1+R_2/R_1)+(I_{Adj}\cdot R_2)$.

NON-PATENT DOCUMENT 1

Texas Instrument Incorporated, "LM317M 3-TERMINAL ADJUSTABLE REGULATOR", [online], in 2000, Texas Instrument Incorporated, searched on Mar. 27, 2007, Internet <URL:http://focus.tij.co.jp/jp/lit/ds/symlink/lm317m.pdf>, p. 7.

DISCLOSURE OF INVENTION

Problems to be Solved by the Invention

However, when an external circuit is used to adjust the output, an area for mounting the external circuit is required and thus the mounting area increases. Also, the component count also increases, the failure rate of the circuit also increases correspondingly, and the manufacturing cost also increases. On the other hand, in the case of configuration in which an output characteristic is adjusted by another terminal for adjustment before sealing with a package, it is impossible to deal with a case in which an output characteristic needs to be adjusted after the functional circuit is sealed with a package. Also, when an output characteristic is adjusted before sealing with a package, it is necessary to adjust the functional circuit, such as an IC chip, in its bare state while measuring a characteristic thereof. Thus, miscellaneous tasks are required such that dedicated jigs for setting are necessary.

Also, a conceivable method is that an adjustment-dedicated terminal is extracted to the outside of the package through a lead or the like and an adjustment signal is input from the dedicated terminal to adjust the functional circuit. In this case, however, since it is necessary to excessively extract the terminal for adjustment, the mounting area of the package increases and the manufacturing cost also increases.

Accordingly, an object of the present invention is to provide an electronic circuit device that can change a characteristic of the functional circuit even after it is sealed with a package and that can achieve a reduction in miscellaneous tasks during characteristic setting, a reduction in cost, a reduction in failure rate, and a reduction in mounting area.

Means for Solving the Problems

A first configuration for an electronic circuit device of the present invention is directed to an electronic circuit device having a circuit main-unit sealed with a package and multiple terminals that connect the circuit main-unit and an external circuit. The electronic circuit device is characterized in that the circuit main-unit comprises:

a functional circuit;

a burst detecting circuit for detecting, from a predetermined terminal of any of the terminals, a prescribed burst signal (hereinafter referred to as a "write activation burst") having a length that is larger than or equal to a prescribed time;

data-reception permitting means for putting the circuit main-unit into an input-enable state in which setting data can be input, when the write activation burst is detected; and data storing means for storing, in the input-enable state, setting data input from the predetermined terminal;

wherein an operation state of the functional circuit is set in accordance with information of the setting data written to the data storing means.

According to this configuration, when the functional circuit is to be adjusted, the write activation burst is input from the "predetermined terminal". Consequently, the circuit main-unit is put into the input-enable state in which setting data can be input. In this state, setting data is input from the "predetermined terminal" and is stored in the data storing means. The operation state of the functional circuit is set in accordance with the information of the setting data written to the data storing means. Consequently, it is possible to adjust an output of the functional circuit.

As described above, there is provided the function for permitting data reception by using the write activation burst, during writing of setting data. This does not require a dedicated terminal for inputting the setting data and makes it possible to cause any of the existing terminals (the terminals intrinsically included in the functional circuit) to serve also as a terminal for inputting the setting data.

The "functional circuit" herein refers to a circuit for realizing a function that is essentially required by the electronic circuit device. For example, for a switching regulator, an output-voltage generating circuit corresponds to the functional circuit, and for a crystal oscillator, an oscillating circuit corresponds to the functional circuit. As the "prescribed burst signal", for example, a pulse or sinusoidal signal having a prescribed frequency, a pulse signal having a prescribed pattern, or the like can be used. The "setting data" refers to data for setting the operation state of the functional circuit.

A second configuration for the electronic circuit device of the present invention is characterized in that, in the first configuration, the data-reception permitting means comprises:

a serial interface for receiving a serial data signal input from the predetermined terminal; and a signal-pattern detecting circuit for detecting a key pattern signal input from the predetermined terminal, when the burst detecting circuit detects the write activation burst;

wherein when the key pattern signal is detected, the serial interface receives setting data subsequently input from the predetermined terminal and writes the setting data to the data storing means.

According to this configuration, even when a signal that is similar to the write activation burst is input from the "predetermined terminal" as a result of noise, no data is written to the data storing means unless the signal-pattern detecting circuit detects the key pattern signal. Thus, it is possible to effectively prevent functional-circuit malfunction caused by invalid data being written to the data storing means.

A third configuration for the electronic circuit device of the present invention is characterized in that, in the first or second configuration, the data storing means comprises a volatile memory and a nonvolatile memory;

the interface receives the setting data input from the predetermined terminal and writes the setting data to the volatile memory;

a power-supply level determining circuit for outputting a write-enable signal when a level of a power-supply voltage input to a power-supply terminal of the circuit main-unit becomes larger than or equal to a write threshold of the nonvolatile memory and a nonvolatile-memory writing circuit for writing data, stored in the volatile memory, to the nonvolatile memory, when the write-enable signal is output are provided; and an operation state of the functional circuit is switched in accordance with information of the setting data written in the volatile memory or the volatile memory.

According to this configuration, the setting data written in the volatile memory is written to the nonvolatile memory, so that the setting of the functional circuit is stored even after the power supply is turned off.

Also, testing of a setting state of the functional circuit is performed in a state in which data is written in the volatile memory. When the output characteristic is a desired characteristic, the level of the power-supply voltage is set to be larger than or equal to the threshold to allow setting data to be written to the nonvolatile memory. As described above, two memories, i.e., the volatile memory and the nonvolatile memory are provided. This makes it possible to make changes to setting at high speed during adjustment of an output characteristic of the functional circuit, makes it possible to store the setting state, and also makes it possible to easily adjust the output characteristic of the functional circuit.

The "write threshold for the nonvolatile memory" has a value that is larger than a typical power-supply voltage and that is smaller than a voltage level required for writing to the nonvolatile memory.

In this case, it is desired that the functional circuit be configured so that the operation state is set to give priority to the setting data written in the volatile memory. This is because rewriting of the volatile memory can be performed at high speed and thus the setting data is written to the volatile memory as a test during adjusting of the output of the functional circuit.

A fourth configuration for the electronic circuit device of the present invention is characterized in that, in any of the first to third configurations, upon receiving the setting data for a predetermined time or corresponding to a predetermined number of bits, the interface re-puts the circuit main-unit into an input-disabled state in which setting data cannot be input.

This configuration makes it possible to effectively avoid an event in which the write-enable state continues for a long time and invalid data is falsely written as a result of noise or the like.

A fifth configuration for the electronic circuit device of the present invention is characterized in that, in any of the first to fourth configurations, the electronic circuit device is a three-terminal device that comprises, as the terminals, three terminals of a power-supply terminal, a ground terminal, and an output terminal.

Thus, even for an electronic circuit device having a minimum number of terminals, such as a three-terminal device, it is possible to adjust an output characteristic thereof.

ADVANTAGES

As described above, according to the present embodiment, the function for permitting data reception by using the write activation burst is provided, and setting data from an existing terminal (a terminal intrinsically included in the functional circuit) is input to perform setting of the functional circuit. This makes it possible to adjust the functional circuit after sealing with a package without having to extract setting-dedicated terminals, the number of which being greater than or equal to the number of terminals of the existing functional circuit, to the outside of the package.

In addition, even for an electronic circuit device having a minimum number of terminals, such as a three-terminal device, it is possible to adjust an output characteristic thereof.

REFERENCE NUMERALS

Figure 1:
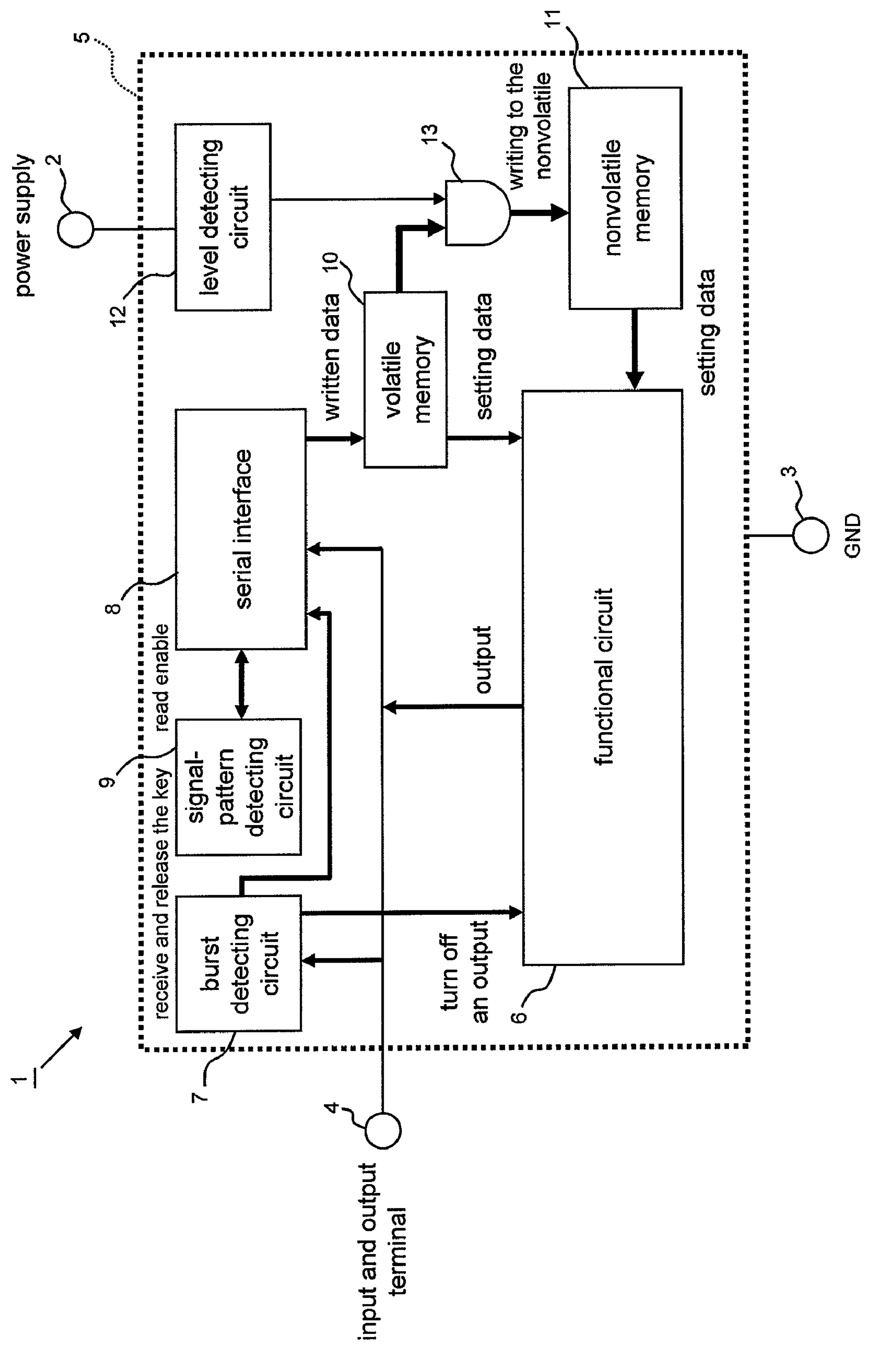
FIG. 1 is a block diagram showing the configuration of an electronic circuit device 1 according to a first embodiment of the present invention.

1 electronic circuit device
2 power supply terminal
3 ground terminal
4 input and output terminal
5 circuit main-unit
6 functional circuit
7 burst detecting circuit
8 serial interface
9 signal-pattern detecting circuit
10 volatile memory
11 nonvolatile memory
12 level detecting circuit
13 nonvolatile-memory writing circuit

BEST MODE FOR CARRYING OUT THE INVENTION

A best mode for carrying out the present invention will be described below with reference to the drawings.

First Embodiment

FIG. 1 is a block diagram showing the configuration of an electronic circuit device 1 according to a first embodiment of the present invention.

The electronic circuit device 1 is a three-terminal device having a circuit main-unit 5 mounted on an IC chip and three terminals of a power-supply terminal 2, a ground terminal 3, and an input and output terminal 4. The circuit main-unit 5 is sealed by a resin mold or a package made of ceramic or the like and the power-supply terminal 2, the ground terminal 3, and the input and output terminal 4 are extracted to the outside of the package through leads.

The circuit main-unit 5 is provided with a functional circuit 6, a burst detecting circuit 7, a serial interface 8, a signal-pattern detecting circuit 9, a volatile memory 10, a nonvolatile memory 11, a level detecting circuit 12, and a nonvolatile-memory writing circuit 13.

The functional circuit 6 is a circuit for realizing a function of a power-supply circuit, an oscillating circuit, or the like, the functional being essentially required by the electronic circuit device 1.

The burst detecting circuit 7 is a circuit for detecting a write activation burst input from the input and output terminal 4. The "write activation burst" herein refers to a pulse signal having a prescribed frequency that is longer than or equal to a prescribed time. The serial interface 8 is an interface for receiving a serial signal input from the input and output terminal 4. When the burst detecting circuit 7 detects the write activation burst, the signal-pattern detecting circuit 9 detects a key pattern signal subsequently input from the input and output terminal 4. The volatile memory 10 and the nonvolatile memory 11 are memories for storing setting data received by the serial interface 8. The level detecting circuit 12 is a circuit for outputting a write-enable signal when the level of a power-supply voltage applied to the power-supply terminal 2 becomes larger than or equal to a write threshold of the nonvolatile memory 11. The "write-enable signal" herein is a 1-bit digital signal. When the write-enable signal is "0", this indicates a write-disable state, and when the write-enable signal is "1", this indicates a write-enable state. When the write-enable signal indicates a write-enable state, the non-volatile-memory writing circuit 13 is a circuit for writing the setting data, stored in the volatile memory 10, to the nonvolatile memory 11.

A description below will be given of the operation of the electronic circuit device 1 of the present embodiment configured as described above.

Figure 2:
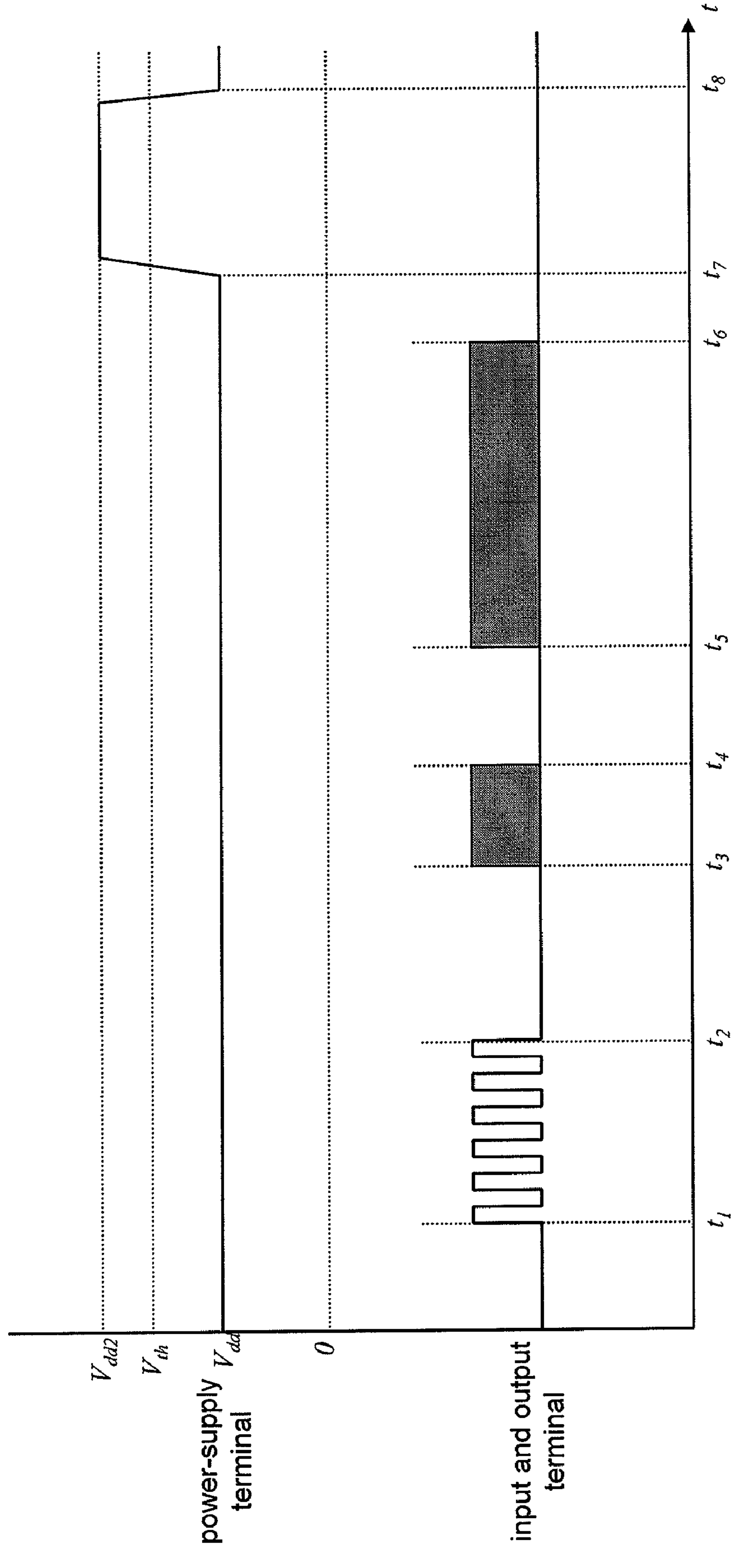
FIG. 2 is a diagram showing a voltage level of a power-supply voltage terminal and an input signal of an input and output terminal during setting-data writing operation of the electronic circuit device 1.
Figure 3:
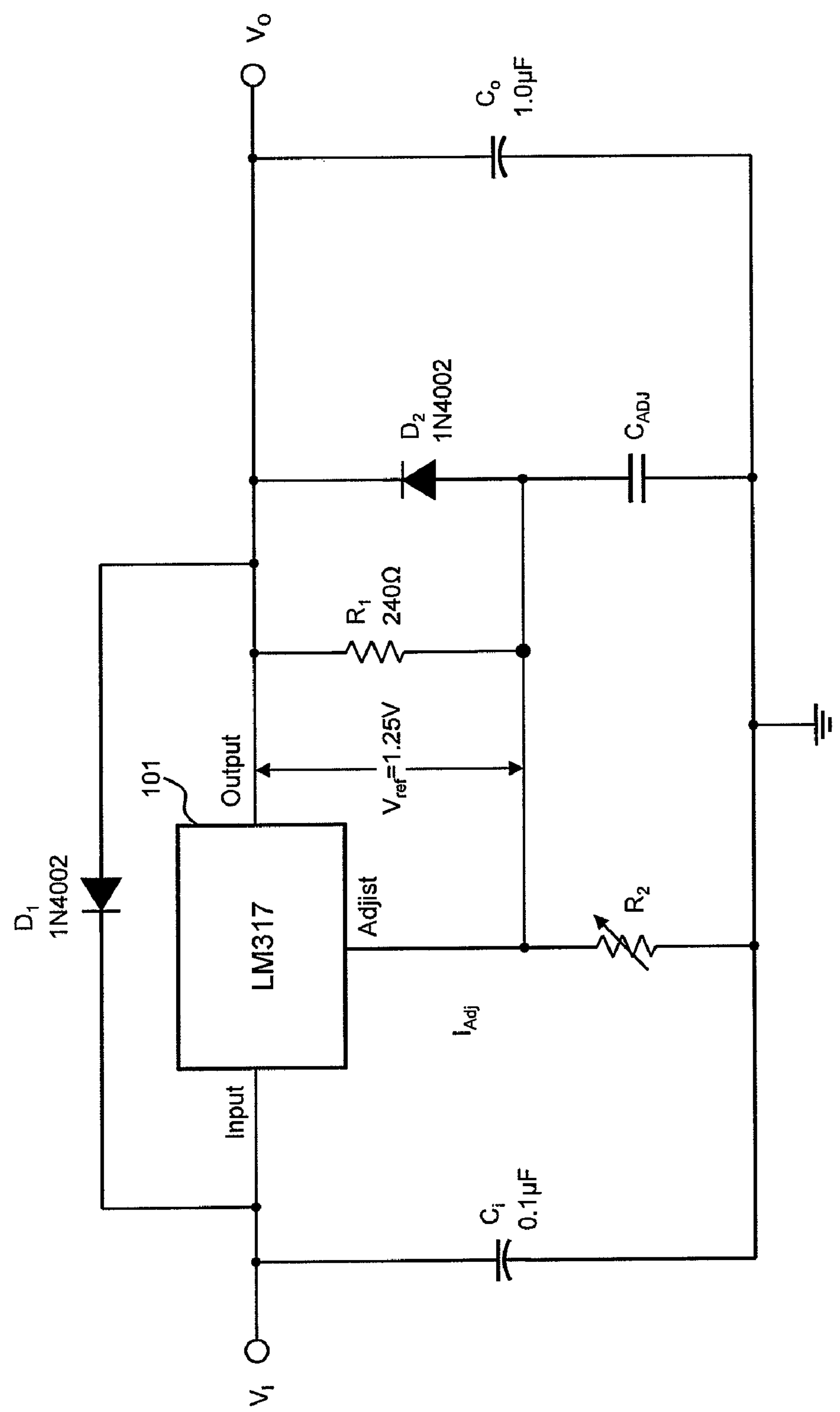
Fig. 3 PRIOR ART
FIG. 3 is an output-setting changing circuit of an electronic circuit device described in Non-Patent Document 1.

FIG. 2 is a diagram showing a voltage level of the power-supply voltage terminal and an input signal of the input and output terminal during setting-data writing operation of the electronic circuit device 1.

In an initial state, the power-supply voltage applied to the power-supply terminal 4 is a normal power-supply voltage $V_{dd}$. In this state, a voltage and so on from the functional circuit 6 are output from the input and output terminal 4.

In the initial state, when setting data is written in the non-volatile memory 11, the functional circuit 6 functions in accordance with the setting data, and when any setting data is not written, the functional circuit 6 functions in a default state.

First Example

For example, in a case in which the functional circuit is a switching regulator circuit, when an output voltage $V_s$ is written in the nonvolatile memory 11 as setting data, the functional circuit 6 outputs the voltage $V_s$ from the input and output terminal 4. When no setting data is written in the nonvolatile memory 11, the functional circuit outputs a default output voltage $V_o$.

(End of Example)

Second Example

For example, in a case in which the functional circuit 6 is an oscillating circuit, when an oscillation frequency $f_s$ is written in the nonvolatile memory 11 as setting data, the functional circuit 6 outputs a pulse having the frequency $f_s$ from the input and output terminal 4. When no setting data is written in the nonvolatile memory 11, the functional circuit 6 outputs a pulse having a default oscillation frequency $f_o$.

(End of Example)

First, at time $t_1$, a pulse signal in a prescribed frequency range is input from the input and output terminal 4 for a prescribed time or more. Consequently, the burst detecting circuit 7 recognizes the input pulse signal as a write activation burst and puts the serial interface 8 into a reception-enable state (hereinafter referred to as a "data reception mode"). Concurrently, an output of the functional circuit 6 is turned off.

In the data reception mode, the serial interface 8 determines whether or not the state is a 0 state or a 1 state on the basis of the pulse width of the pulse input from the input and output terminal 4. The pulse width for the determination criterion is prescribed by an internal time-constant circuit (not shown).

Next, during time $t_3$ to $t_4$, a key pattern signal is input from the input and output terminal 4. The serial interface 8 receives the key pattern signal and outputs it to the signal-pattern detecting circuit 9. Upon recognizing that a signal data input from the serial interface 8 is a key pattern signal, the signal-pattern detecting circuit 9 sets the state of the serial interface 8 to a state for performing writing to the volatile memory 10 (hereinafter referred to as a "writing mode")

Proceeding to the writing mode only when the pattern of the signal received by the serial interface 8, the pattern indicating 0 or 1, satisfies a certain condition, as described above, makes it possible to prevent false writing due to noise or the like.

Next, during time $t_5$ to $t_6$, setting data is input from the input and output terminal 4. Upon receiving the setting data, the serial interface 8 writes it to the volatile memory 10. Upon receiving setting data having a predetermined length, the serial interface 8 is reset to the reception-disable state again. Also, when the serial interface 8 is reset to the reception-disable state, the output of the functional circuit 6 is turned on again.

On the other hand, when setting data is written to the volatile memory 10, the functional circuit 6 switches the functional state in accordance with the setting data.

Third Example

For example, in a case in which the functional circuit 6 is a switching regulator circuit, when an output voltage $V_{s1}$ is written to the volatile memory 10 as setting data, the functional circuit 6 switches the functional state so as to output the voltage $V_{s1}$ from the input and output terminal 4 regardless of whether or not setting data is written in the nonvolatile memory 11.

(End of Example)

Fourth Example

For example, in a case in which the functional circuit 6 is an oscillating circuit, when an oscillation frequency $f_{s1}$ is written to the volatile memory 10 as setting data, the functional circuit 6 outputs a pulse having the frequency $f_{s1}$ from the input and output terminal 4 regardless of whether or not setting data is written in the nonvolatile memory 11.

(End of Example)

As described above, writing setting data to the volatile memory 10 makes it possible to change the functional state of the functional circuit 6.

Next, during time $t_7$ to $t_8$, the level of the power-supply voltage applied to the power-supply terminal 2 is set to a voltage level $V_{dd2}$ required for writing to the nonvolatile memory 11. The level detecting circuit 12 determines that the level of the power-supply voltage becomes larger than the write threshold $V_{th}$, and outputs "1" as the write-enable signal. The "write threshold $V_{th}$" herein has a value that is larger than the normal power-supply voltage $V_{dd}$ and that is smaller than the voltage level $V_{dd2}$ required for writing to the nonvolatile memory 11.

When the write-enable signal becomes "1", the nonvolatile-memory writing circuit 13 outputs the setting data, written in the volatile memory 10, to the nonvolatile memory 11 to perform writing. Consequently, the setting data is nonvolatilized, so that the setting data is stored even after the power supply is turned off.

As described above, according to the electronic circuit device 1 of the present embodiment, the function for permitting data reception of the serial interface 8 by using the write activation burst is provided and setting data from the output terminal (the input and output terminal 4) of the functional circuit 6 is input to perform setting of the functional circuit 6. Thus, it is possible to adjust the functional circuit 6 after package sealing without having to extract setting-dedicated terminals, the number of which being greater than or equal to the number of terminals normally required by the functional circuit 6, to the outside of the package.

Also, the two-step setting processing for performing data writing is employed, that is, when the write activation burst is received, the serial interface 8 is put into the data reception mode, and then, when the key pattern signal is received, the serial interface 8 is put into the writing mode. This makes it possible to effectively prevent false writing due to noise or the like.

The invention claimed is:

1. An electronic circuit device having a circuit main-unit sealed with a package and multiple terminals that connect the circuit main-unit and an external circuit, the electronic circuit device being characterized in that the circuit main-unit comprises:

a functional circuit;

a burst detecting circuit for detecting, from a predetermined terminal of any of the terminals, a prescribed burst signal (hereinafter referred to as a "write activation burst") having a length that is larger than or equal to a prescribed time;

data-reception permitting means for putting the circuit main-unit into an input-enable state in which setting data can be input, when the write activation burst is detected; and data storing means for storing, in the input-enable state, setting data input from the predetermined terminal;

wherein an operation state of the functional circuit is set in accordance with information of the setting data written to the data storing means.

2. The electronic circuit device according to claim 1, characterized in that the data-reception permitting means comprises:

a serial interface for receiving a serial data signal input from the predetermined terminal; and a signal-pattern detecting circuit for detecting a key pattern signal input from the predetermined terminal, when the burst detecting circuit detects the write activation burst;

wherein when the key pattern signal is detected, the serial interface receives setting data subsequently input from the predetermined terminal and writes the setting data to the data storing means.

3. The electronic circuit device according to claim 2, characterized in that the data storing means comprises a volatile memory and a nonvolatile memory;

the serial interface receives the setting data input from the predetermined terminal and writes the setting data to the volatile memory;

a power-supply level determining circuit for outputting a write-enable signal when a level of a power-supply voltage input to a power-supply terminal of the circuit main-unit becomes larger than or equal to a write threshold of the nonvolatile memory and a nonvolatile-memory writing circuit for writing data, stored in the volatile memory, to the nonvolatile memory, when the write-enable signal is output are provided; and an operation state of the functional circuit is switched in accordance with information of the setting data written in the volatile memory.

4. The electronic circuit device according to claim 3, characterized in that the electronic circuit device is a three-terminal device that comprises, as the terminals, three terminals of a power-supply terminal, a ground terminal, and an output terminal.

5. The electronic circuit device according to claim 3, characterized in that, upon receiving the setting data for a predetermined time or corresponding to a predetermined number of bits, the serial interface re-puts the circuit main-unit into an input-disabled state in which setting data cannot be input.

6. The electronic circuit device according to claim 5, characterized in that the electronic circuit device is a three-terminal device that comprises, as the terminals, three terminals of a power-supply terminal, a ground terminal, and an output terminal.

7. The electronic circuit device according to claim 2, characterized in that, upon receiving the setting data for a predetermined time or corresponding to a predetermined number of bits, the serial interface re-puts the circuit main-unit into an input-disabled state in which setting data cannot be input.

8. The electronic circuit device according to claim 7, characterized in that the electronic circuit device is a three-terminal device that comprises, as the terminals, three terminals of a power-supply terminal, a ground terminal, and an output terminal.

9. The electronic circuit device according to claim 2, characterized in that the electronic circuit device is a three-terminal device that comprises, as the terminals, three terminals of a power-supply terminal, a ground terminal, and an output terminal.

10. The electronic circuit device according to claim 1, characterized in that the data storing means comprises a volatile memory and a nonvolatile memory;

the serial interface receives the setting data input from the predetermined terminal and writes the setting data to the volatile memory;

a power-supply level determining circuit for outputting a write-enable signal when a level of a power-supply voltage input to a power-supply terminal of the circuit main-unit becomes larger than or equal to a write threshold of the nonvolatile memory and a nonvolatile-memory writing circuit for writing data, stored in the volatile memory, to the nonvolatile memory, when the write-enable signal is output are provided; and an operation state of the functional circuit is switched in accordance with information of the setting data written in the volatile memory.

11. The electronic circuit device according to claim 1, characterized in that, upon receiving the setting data for a predetermined time or corresponding to a predetermined number of bits, the serial interface re-puts the circuit main-unit into an input-disabled state in which setting data cannot be input.

12. The electronic circuit device according to claim 11, characterized in that the electronic circuit device is a three-terminal device that comprises, as the terminals, three terminals of a power-supply terminal, a ground terminal, and an output terminal.

13. The electronic circuit device according to claim 10, characterized in that, upon receiving the setting data for a predetermined time or corresponding to a predetermined number of bits, the serial interface re-puts the circuit main-unit into an input-disabled state in which setting data cannot be input.

14. The electronic circuit device according to claim 13, characterized in that the electronic circuit device is a three-terminal device that comprises, as the terminals, three terminals of a power-supply terminal, a ground terminal, and an output terminal.

15. The electronic circuit device according to claim 10, characterized in that the electronic circuit device is a three-terminal device that comprises, as the terminals, three terminals of a power-supply terminal, a ground terminal, and an output terminal.

16. The electronic circuit device according to claim 1, characterized in that the electronic circuit device is a three-terminal device that comprises, as the terminals, three terminals of a power-supply terminal, a ground terminal, and an output terminal.

* * * * *